US012626883B2

(12) United States Patent
Lebow

(10) Patent No.: US 12,626,883 B2
(45) Date of Patent: May 12, 2026

(54) APPARATUS AND METHOD FOR MANIPULATING A MICROSCOPIC SAMPLE

(71) Applicant: FEI Company, Hillsboro, OR (US)

(72) Inventor: Joseph M Lebow, Hillsboro, OR (US)

(73) Assignee: FEI Company, Hilllsboro, OR (US)

( * ) Notice: Subject to any disclaimer, the term of this patent is extended or adjusted under 35 U.S.C. 154(b) by 434 days.

(21) Appl. No.: 18/352,043

(22) Filed: Jul. 13, 2023

(65) Prior Publication Data

US 2025/0022677 A1     Jan. 16, 2025

(51) Int. Cl.
*H01J 37/20*         (2006.01)
*H01J 37/244*        (2006.01)
*H01J 37/28*         (2006.01)

(52) U.S. Cl.
CPC ............ *H01J 37/20* (2013.01); *H01J 37/244* (2013.01); *H01J 37/28* (2013.01); *H01J 2237/2007* (2013.01); *H01J 2237/20235* (2013.01); *H01J 2237/20264* (2013.01); *H01J 2237/20278* (2013.01)

(58) Field of Classification Search
CPC .. H01J 37/00; H01J 37/02; H01J 37/20; H01J 37/244; H01J 37/26; H01J 37/28; H01J 2237/2007; H01J 2237/20214; H01J 2237/20221; H01J 2237/20235; H01J 2237/20264; H01J 2237/20278; H01J 2237/208; H01J 2237/31745; G01N 23/2204; G01N 23/2251; G02B 21/32
USPC ............................ 250/306, 307, 311, 442.11
See application file for complete search history.

(56) References Cited

U.S. PATENT DOCUMENTS

| | | | |
|---|---|---|---|
| 7,005,636 B2 | 2/2006 | Tappel | |
| 7,208,724 B2 | 4/2007 | Moore et al. | |
| 9,449,786 B2 | 9/2016 | Tsuchiya et al. | |
| 10,663,414 B2 | 5/2020 | Bauer | |
| 2014/0312227 A1* | 10/2014 | Yoshikawa | H01J 37/023 |
| | | | 250/310 |
| 2020/0152418 A1* | 5/2020 | Arts | G01N 23/2251 |
| 2021/0375580 A1* | 12/2021 | Van Der Toorn | H02G 11/00 |
| 2023/0143810 A1* | 5/2023 | Seo | H01B 7/22 |
| | | | 320/109 |

FOREIGN PATENT DOCUMENTS

| | | |
|---|---|---|
| CN | 111613507 A | 9/2020 |
| EP | 3637453 A1 | 4/2020 |

OTHER PUBLICATIONS

Shenoy, A, "Design and development of microwire feeder for laser applications," Missouri University of Science and Technology, Masters Theses, 2010, 83 pages.

* cited by examiner

*Primary Examiner* — Jason L Mccormack
(74) *Attorney, Agent, or Firm* — Bo Wang

(57) ABSTRACT

A sample manipulation system for a sample to be used in a charged particle beam process. The sample manipulation system includes a carrier defining a passageway, a wire slidably supported and at least partially housed by the carrier, and a feed mechanism. The wire is configured to slide through the passageway. The wire includes a supported portion and a protruding portion. The supported portion is disposed in the passageway and the protruding portion extends from the carrier for engaging the sample. The feed mechanism is configured to drive the wire through the passageway to control a length of the protruding portion.

19 Claims, 6 Drawing Sheets

APPARATUS AND METHOD FOR MANIPULATING A MICROSCOPIC SAMPLE

FIELD OF THE INVENTION

The present disclosure relates to a sample manipulation system, and more particularly, to a sample manipulation system in a charged particle microscope.

SUMMARY

In one aspect, the disclosure provides a sample manipulation system for a sample to be used in a charged particle beam process. The sample manipulation system includes a carrier defining a passageway, a wire slidably supported and at least partially housed by the carrier, and a feed mechanism. The wire is configured to slide through the passageway. The wire includes a supported portion and a protruding portion. The supported portion is disposed in the passageway and the protruding portion extends from the carrier for engaging the sample. The feed mechanism is configured to drive the wire through the passageway to control a length of the protruding portion.

In another aspect, the disclosure provides a method of manipulating a sample with the sample manipulation system. The method includes acquiring an image; driving, via a first actuator of the sample manipulation system, the wire through the passageway to a predetermined length of the protruding portion of the wire; and adjusting, via a second actuator coupled to the sample manipulation system, a distance between a distal end of the wire and the sample.

In another aspect, the disclosure provides a charged particle microscope. The microscope includes a sample holder for holding a sample; a sample manipulation system comprising: a carrier defining a passageway; a wire slidably supported and at least partially housed by the carrier, the wire including a supported portion and a protruding portion, wherein the supported portion is disposed in the passageway and the protruding portion extends from the carrier for engaging the sample; and a feed mechanism including a first actuator for driving the wire along the passageway; a second actuator coupled to the sample manipulation system; at least a detector; and a controller including a processor and a non-transitory memory for storing computer readable instructions, by executing the instructions in the processor, the charged particle microscope is configured to: acquire, via the detector, an image; adjust, via the first actuator, a length of a protruding portion of the wire from the carrier based on the acquired image; and adjust, via the second actuator, a relative position between a sample and a distal end of the wire.

Other aspects of the disclosure will become apparent by consideration of the detailed description and accompanying drawings.

DETAILED DESCRIPTION

Figure 1:
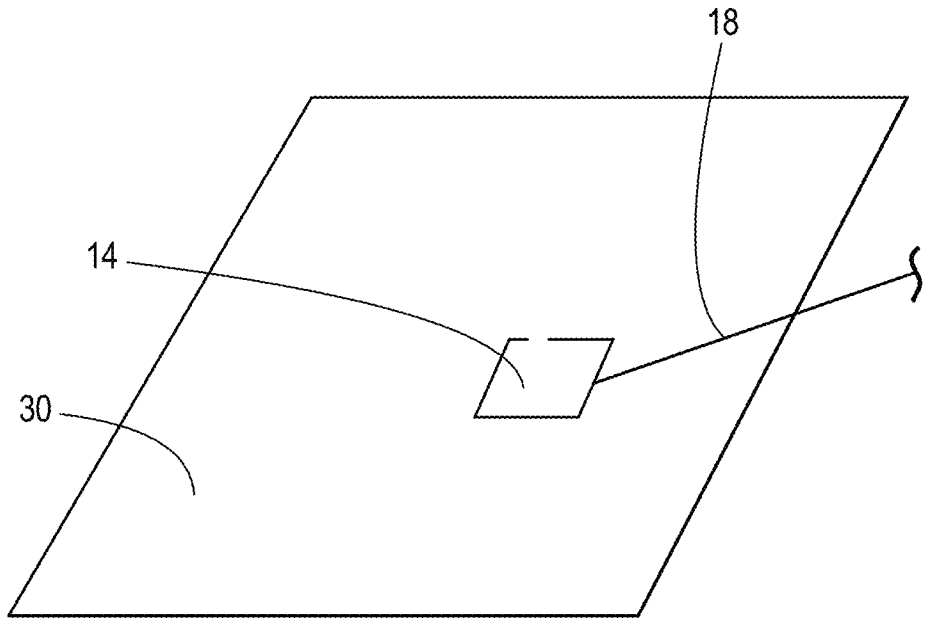
FIG. 1 is a schematic diagram of a step of a lift-out process.

To prepare a sample for a charged particle beam process (such as inspection by transmission electron microscopy (TEM), scanning electron microscopy (SEM), etc.,) the sample is milled into a thin lamella. Some techniques for preparing TEM samples may involve cleaving, chemical polishing, mechanical polishing, or broad beam low energy ion milling. Combinations of these techniques are also possible. These techniques often require that the starting material be sectioned into smaller and smaller pieces, thereby destroying much of the original sample. Other techniques generally referred to as "lift-out" procedures use a focused ion beam (FIB) to cut the sample from a substrate while greatly limiting or eliminating damage to surrounding areas of the substrate. These techniques are useful for analyzing the results of semiconductor manufacture, for example.

A distal end of a wire (or needle) may be attached to the sample (such as a sample processed through milling) for removing the sample from the bulk material. The sample may be held by the wire for further processing or transferring to be inspected by another tool, such as a TEM. Transportation to the TEM grid may occur without removing the sample from the milling chamber. The sample may be attached to the TEM grid and then the wire may be severed such that the sample remains with the TEM grid. A small portion of the wire may also remain with the sample. As a result of the wire being severed, said small portion of the wire is consumed, decreasing a length of the remaining wire. This process may be referred to as the "lift-out" process. Other details of the lift-out process are described in U.S. Pat. No. 7,005,636, the entire contents of which are incorporated by reference herein.

Automation of the process of lamella handling (e.g., lifting-out and transporting the lamella from the wafer to the TEM grid) to scale up production encounters numerous difficulties, such as the need to replace the wire as a result of wire consumption. Replacing the wire is a time-consuming process that requires venting the chamber and then restoring operating conditions after wire replacement. Also, after severing the wire attached to the sample, the diameter of the wire may need to be reduced, for example by milling with a focused ion beam, before performing another lift-out, which is also time consuming.

For consistency across multiple lift-outs, and to reduce or eliminate the milling time, a width/diameter of the wire is preferably constant or near constant. Further, the sample manipulation system is preferably capable of providing a wire long enough to accommodate many lift-outs (e.g., thousands or tens of thousands of lift-outs) before replacement is needed. This may greatly reduce or eliminate the number of times the wire must be replaced. The disclosure provides a sample manipulation system and method for advancing the wire as it is consumed, reducing or eliminating the need for frequent needle replacements.

A sample manipulation system and method for manipulating a microscopic sample are disclosed herein. The sample manipulation system includes a wire, a carrier, and a feed mechanism. The carrier defines a passageway through which the wire may slide. At least a portion of the wire in the passageway is supported by the carrier or the passageway formed by the carrier. The passageway may be straight and may have different cross-sectional areas along the length of the passageway. The wire in the passageway may be substantially straight. The portion of the passageway supporting the wire may have the smallest cross-sectional area of the entire passageway, so as to confine the lateral movement of the wire within the passageway. One distal end of the wire protruding outside of the carrier may be attached to the sample and support the sample during the lift-out process. The feed mechanism may be configured to drive the wire along the passageway to control a length of the wire protruding from the carrier. In some examples, some or all of the passageway may be curved.

In one example, the wire has a uniform width or diameter. The cross-section of the wire may be round, square, or any other suitable cross-section. The width of the wire (which may also be referred to herein as the diameter of the wire, e.g., when the wire has a round cross-section) may be 10 micrometers or less. In other examples, the width may be 5 micrometers or less. In other examples, the width may be 2 micrometers or less. In other examples, the width may be 50 micrometers or less. In other examples, a portion of the wire (e.g., opposite to the distal end protruding from the carrier) may be wrapped around a spool. If the width or the diameter of the wire is less than 5 micrometers, such as 2 micrometers, the step of FIB thinning of the wire tip may be skipped.

The carrier may at least partially house and support at least a portion of the wire. The carrier may be tubular, channeled, a combination thereof, or any suitable shape for receiving, supporting, and at least partially housing the wire. Tubular may include cylindrical or a tube having a cross-section of any shape. Channeled may include a groove to form the passageway for receiving the wire and may have a cross-section of any shape. The passageway defined by the carrier may have cross-sections of any suitable shape.

The feed mechanism drives the wire along the length of the passageway and controls the length of the protruding portion of the wire. For example, the feed mechanism can drive the wire in a feed direction to increase the length of the protruding portion. The feed mechanism may include an actuator (which may also be referred to herein as a first actuator) for driving the wire along the passageway. The wire may be operably coupled to the actuator. The actuator may drive the wire using any suitable means. For example, the actuator may be a piezoelectric actuator or a motor or any other suitable drive device powered electrically.

The actuator may be coupled with the wire via a clamp mechanism or a pinch roller. In one example, the clamp mechanism may be positioned at the end of the passageway opposite to the end of the protruding wire, to drive the wire along the passageway. The clamp mechanism may be fixed at a location of the wire and moves together with the wire as the wire moves along the passageway. The clamp mechanism may be partially or entirely closed in the carrier. That is, at least a part of the claim mechanism is within the passageway.

In another example, the actuator may be coupled with the wire through a plurality of rollers, such as pinch rollers. The rollers may be positioned anywhere along the passageway. In one example, the rollers may engage with the wire at the end of the carrier opposite to protruding wire. In another example, the rollers may be engaged with the wire through openings on the carrier. In yet another example, the rollers may be enclosed in the carrier. The wire may be disposed between the plurality of rollers such that the rollers sandwich the wire and drive the wire in the feed direction. The rollers may clamp and drive the wire directly or indirectly.

In yet another example, the actuator may be coupled with the wire via a spool. The end of the wire opposite to the end that protrudes from the carrier may be winded one the spool positioned within a shroud. The actuator may rotate the spool to move the wire along the passageway.

The sample manipulation system may be incorporated in a charged particle microscope for sample handling. The sample manipulation system may be coupled to one or more second actuators for adjusting the relative position of the distal end of the wire from the sample. The second actuators may translate and rotate the sample attached to the wire. The second actuators may be a precision manipulator that provides at least four degrees of freedom (i.e., X, Y, Z translations and rotation) for moving and positioning the sample in the three-dimensional space.

In one example, the charged particle microscopy system may include a first detector for detecting the length of the protruding portion of the wire. The actuator of the feed mechanism may be actuated based on the detected length of the protruding portion. The first detector may be an optical detector or a charged particle detector. The first detector may acquire image(s) including a portion of the carrier. The feed mechanism may be configured to drive the wire to a predetermined feed length in response to the detected length of the protruding portion. The charged particle microscope system may further include a second detector for detecting the relative position of the distal end of the wire from the sample. The second detector may acquire image(s) including the sample and the distal end of the wire. The second actuators may be actuated based on the detected relative position. In one example, the first and second detectors are the same detector, such as electron detectors for acquiring SEM images.

Before any implementations of the disclosure are explained in detail, it is to be understood that the disclosure is not limited in its application to the details of construction and the arrangement of components set forth in the following description or illustrated in the following drawings. The disclosure is capable of other implementations and of being practiced or of being carried out in various ways.

Figure 3:
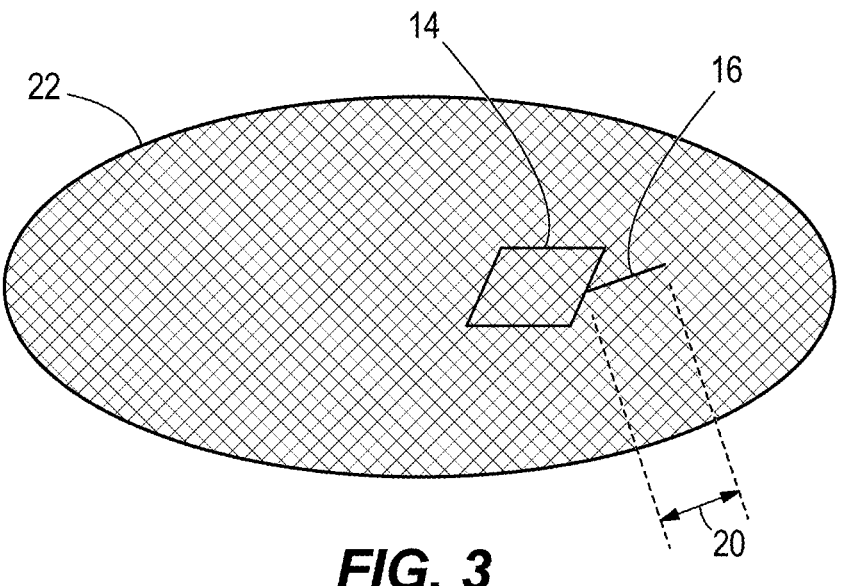
FIG. 3 is a schematic diagram of another step of the lift-out process.
Figure 4:
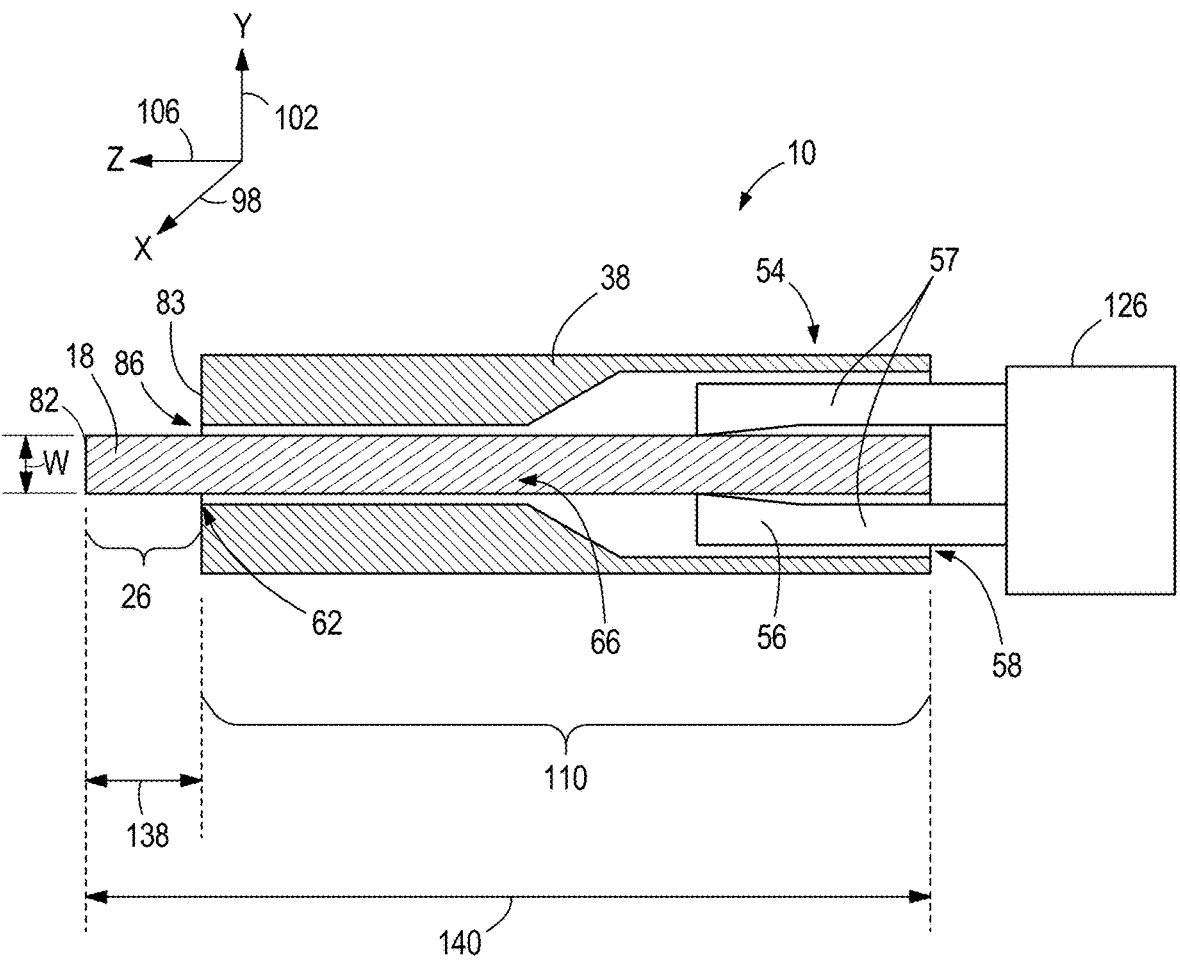
FIG. 4 is a schematic diagram of a sample manipulation system.
Figure 5:
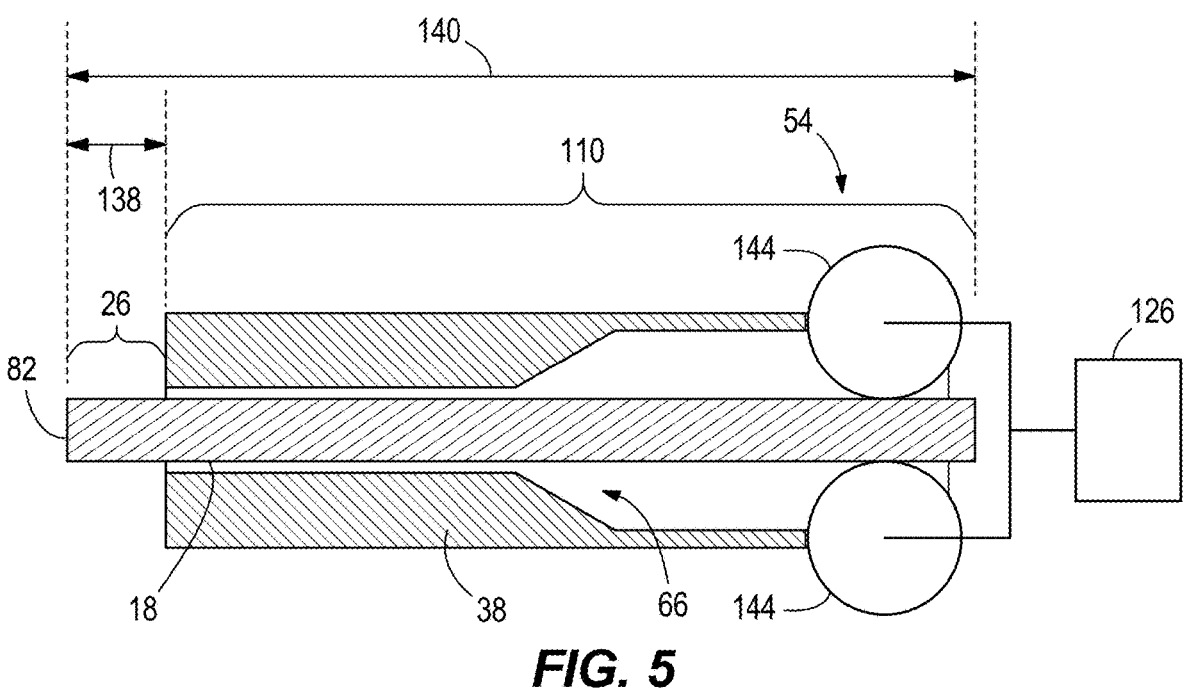
FIG. 5 is a schematic diagram of another implementation of the sample manipulation system.
Figure 6:
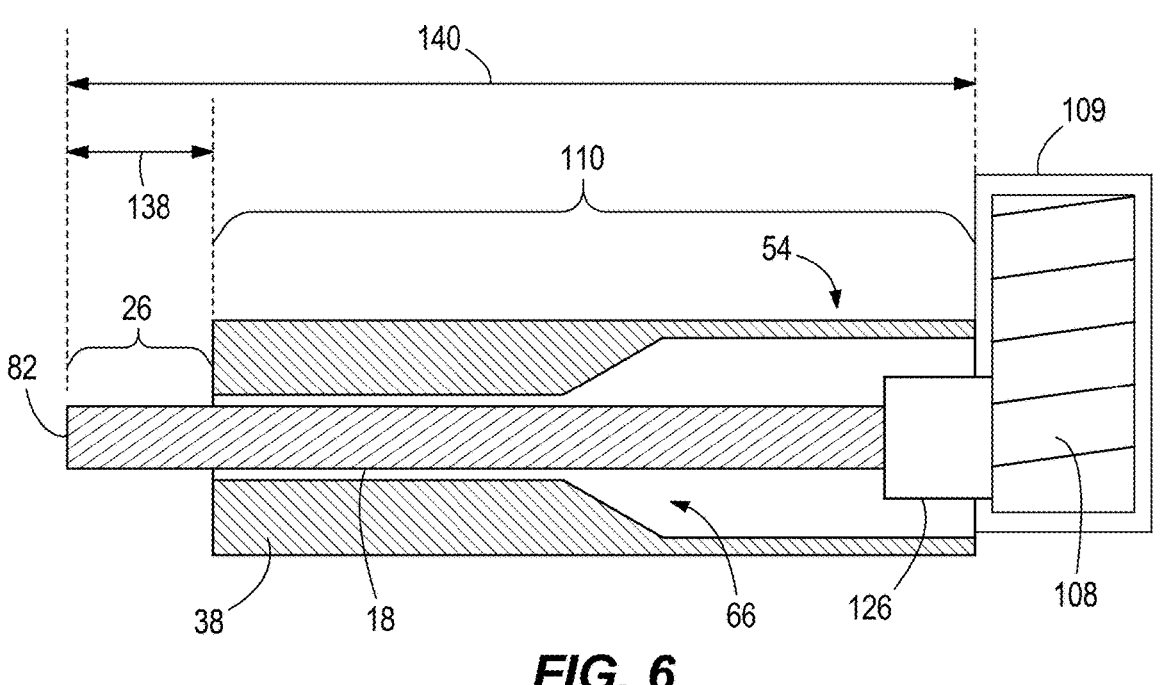
FIG. 6 is a schematic diagram of yet another implementation of the sample manipulation system.

The present disclosure relates to a sample manipulation system 10 (which may simply be referred to as a manipulation system 10), primarily illustrated in FIGS. 4-6, for a sample 14 to be analyzed or processed by a charged particle beam, e.g., a transmission electron microscope TEM as one example. The illustrated application is only one example, and the manipulation system 10 may be utilized in any sample manipulation application. The sample manipulation procedure may further be referred to as a "lift-out" process and includes picking up the sample 14 using a wire 18 (FIG. 1), attaching the sample 14 to another object (which may be referred to herein as a holder) such as a TEM grid 22 (FIG. 2), and severing the wire 18 (FIG. 3).

Figure 2:
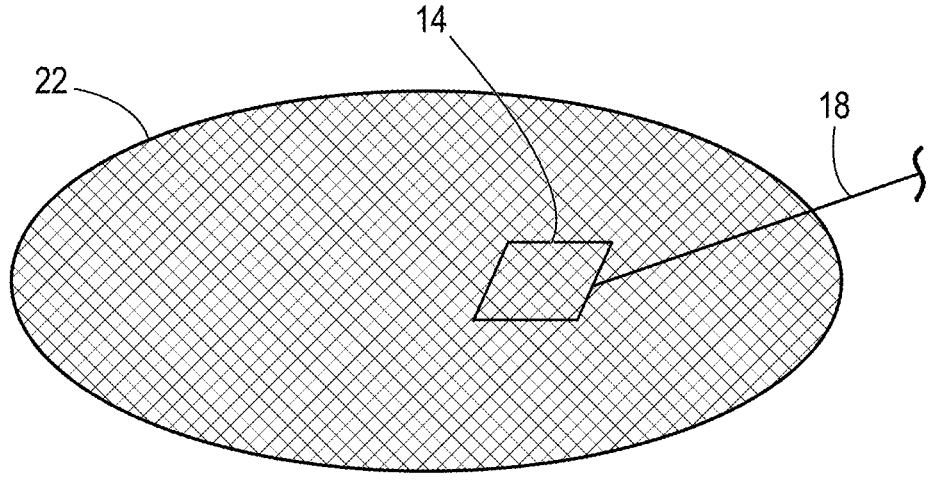
FIG. 2 is a schematic diagram of another step of the lift-out process.

FIGS. 1-3 illustrate an example lift-out process, and FIG. 4 illustrates the sample manipulation system 10 with FIGS. 5 and 6 depicting alternative sample manipulation systems. With reference to FIGS. 1-4, the manipulation system 10 may be configured for carrying the sample 14 after the sample 14 is removed from a wafer 30 (FIG. 1) and delivering the sample 14 to the TEM grid 22 (FIG. 2) for analysis by a TEM. The manipulation system 10 (FIG. 4) includes a carrier 38, the wire 18, and a feed mechanism 54.

In the illustrated implementation, with particular reference to FIG. 4, the carrier 38 is configured to at least partially support the wire 18. The carrier 38 at least includes a solid body for at least partially supporting the wire 18 but may include other structures. Any configuration of the carrier 38 for supporting the wire 18 is possible. As one example, the carrier 38 has a first carrier end 58 and a second carrier end 62 and defines a passageway 66 through which the wire 18 may be disposed. The passageway 66 defines an aperture 86 through which the wire 18 may be fed. In the illustrated example, the carrier 38 may be formed as a hollow cylinder. The carrier 38 may be tubular, channeled, a combination thereof, or any suitable shape for receiving, supporting, and at least partially housing the wire 18. Tubular may include cylindrical or a tube having a cross-section of any shape. Channeled may include a groove to form the passageway for receiving the wire 18 and may have a cross-section of any shape.

The carrier 38 includes a distal end 83 from which the wire 18 protrudes. As one example, the carrier 38 may be made of a polymer. As another example, the carrier 38 may be made of metal, ceramic, polymer, or any combination thereof.

In the illustrated implementation, the wire 18 has a uniform width W (FIG. 4). The width W of the wire 18 may be 5 micrometers or less. As one example, the width W is 5 micrometers. As another example, the width W is 2.5 micrometers. In other implementations, the width W may be 50 micrometers or less. The wire 18 may have any suitable wire length. In one example, the wire 18 has a wire length 140 of at least 10 mm. In some implementations, the wire length 140 may be longer than 50 mm. In the illustrated implementation, the wire 18 may be substantially straight. In other implementations, the wire 18 may be curved, bent, wound, or any combination thereof, especially on the first carrier end 58.

With continued reference to FIG. 4, the wire 18 is slidably supported and at least partially housed by the carrier 38. The wire 18 may be characterized as a flexible strand (e.g., the wire is easily manipulated or malleable) or a rigid strand. In the implementation in which the wire 18 is a flexible strand, the wire 18 may be provided as a generally straight length of wire or wound around a spool 108 (as shown in the implementation of FIG. 6, which will be described in greater detail below). The wire 18 may be made partially or wholly of metal, such as tungsten or any other suitable metal or combination of metals. In some implementations, the material may additionally or alternatively include plastic, polymer, glass, ceramics, synthetic fibers, or other materials. The wire 18 may be configured to slide through the passageway 66 in a feed direction 106. The feed direction 106 (i.e., Z direction or Z-axis) may be away from the carrier 38 such that a protruding portion 26 (from a distal end 82 of the wire 18 to the distal end 83 of the carrier 38) of the wire 18 increases in length. Further, the feed direction 106 may be toward the sample 14.

The wire 18 includes a supported portion 110 and the protruding portion 26. The supported portion 110 may be disposed within the passageway 66. The supported portion 110 may be at least partially supported by the carrier 38. The protruding portion 26 of the wire 18 extends from the carrier 38 and through the aperture 86. The protruding portion 26 may be understood as any portion of the wire 18 extending from the carrier 38 (e.g., not housed within the carrier 38) in the feed direction 106. The protruding portion 26 may be configured to engage the sample 14. The protruding portion 26 may be further configured to support the sample 14 when attached thereto.

As illustrated in FIG. 4, the feed mechanism 54 is configured for moving the wire 18 with respect to the carrier 38, e.g., such that the wire 18 slides through the passageway 66. The feed mechanism 54 at least includes an actuator 126 (which may be referred to herein as a first actuator) for moving the wire 18 with respect to the carrier 38. In the illustrated implementation, one actuator 126 may be employed. In other implementations, a combination of one or more actuators 126 may be employed. The actuator 126 may be a piezoelectric actuator, a motor, any type of linear actuator, or any other suitable actuator or motor type. The actuator 126 may be electrically powered. In response to being activated, the actuator 126 drives the wire 18 a drive length, which may be any desired length. As one example, the drive length may be 15 micrometers. As another example, the drive length may be any length in the range of 1 micrometer to 20 micrometers.

Thus, the feed mechanism 54 may be configured to drive the wire 18 through the passageway 66 in the feed direction 106, e.g., parallel to or along the Z axis 106 in the illustrated orientation. A portion of the feed mechanism 54 may be housed within the carrier 38, or the feed mechanism 54 may be disposed entirely within the carrier 38. Alternatively, the feed mechanism 54 may be located adjacent to the carrier 38. Any location is contemplated, depending on the application.

Other components of the feed mechanism 54 may take on any suitable form, e.g., for gripping and/or guiding the wire 18 during movement driven by the actuator 126.

As one example, FIG. 4 illustrates that the feed mechanism 54 may include a clamp 56 configured to apply a clamping force to the wire 18 such that the wire 18 is firmly gripped. The actuator 126 may be configured to move the clamp 56 linearly, e.g., in a Z-direction 106, to move the wire 18 correspondingly. The clamp 56 may be in direct contact with the wire 18 at one or more locations of the wire 18. The clamp 56 may include two or more jaws 57 biased towards each other and configured to apply a clamping force on the wire 18, and may have any other suitable configuration in other examples for coupling the wire 18 to the actuator 126. For example, the clamp 56 is in direct contact circumferentially with the wire 18. The clamp 56 may travel with the wire 18 while the wire 18 travels along the passageway 66.

The passageway 66 may have different cross-sectional areas along its length (Z axis). The cross-sectional area on the first carrier end 58 may be larger than the second carrier end 62, to accommodate the clamp mechanism (e.g., clamp 56) as the wire 18 is driven in the feed direction 106.

In another example, illustrated in FIG. 5, the feed mechanism 54 may include a plurality of pinch rollers 144. The example of FIG. 5 uses many of the same components as the example of FIG. 4, and only the differences are described herein. Like components are labeled with the same reference numerals as those in FIG. 4 and reference is made to their description herein and need not be repeated. The pinch rollers 144 may be driven by the actuator 126 such that activation of the actuator 126 causes the pinch rollers 144 to rotate. Thus, the pinch rollers 144 may drive the wire 18 in response to activation of the actuator 126. One, some, or all pinch rollers 144 may be actively driven, and any remaining may be passively driven. The pinch rollers 144 may clamp the wire 18. The wire 18 may be sandwiched between the pinch rollers 144 such that the pinch rollers 144 directly engage the wire 18, apply a clamping force thereto, and drive the wire 18 during rotation of the pinch rollers 144. As another example, the pinch rollers 144 may pinch a sleeve (not shown) around the wire 18 (as the wire 18 itself may be very thin). Such a sleeve (not shown) may be embodied similarly to the clamp 56, and movement of the pinch rollers 144 would feed the sleeve (not shown) and thereby also feed the wire 18. In some examples, the passageway 66 may have a constant cross-section along its length.

In yet another example, illustrated in FIG. 6, the wire 18 may be driven by an actuator 126 connected to a spool 108. The end of the wire 18 opposite to the distal end 82 is wound on the spool 108. The spool 108 is enclosed in a shroud 109 with the wire 18 extending through the shroud 109. The wire 18 moves along the passageway 66 by rotating the spool 108 with the actuator 126.

Figure 7:
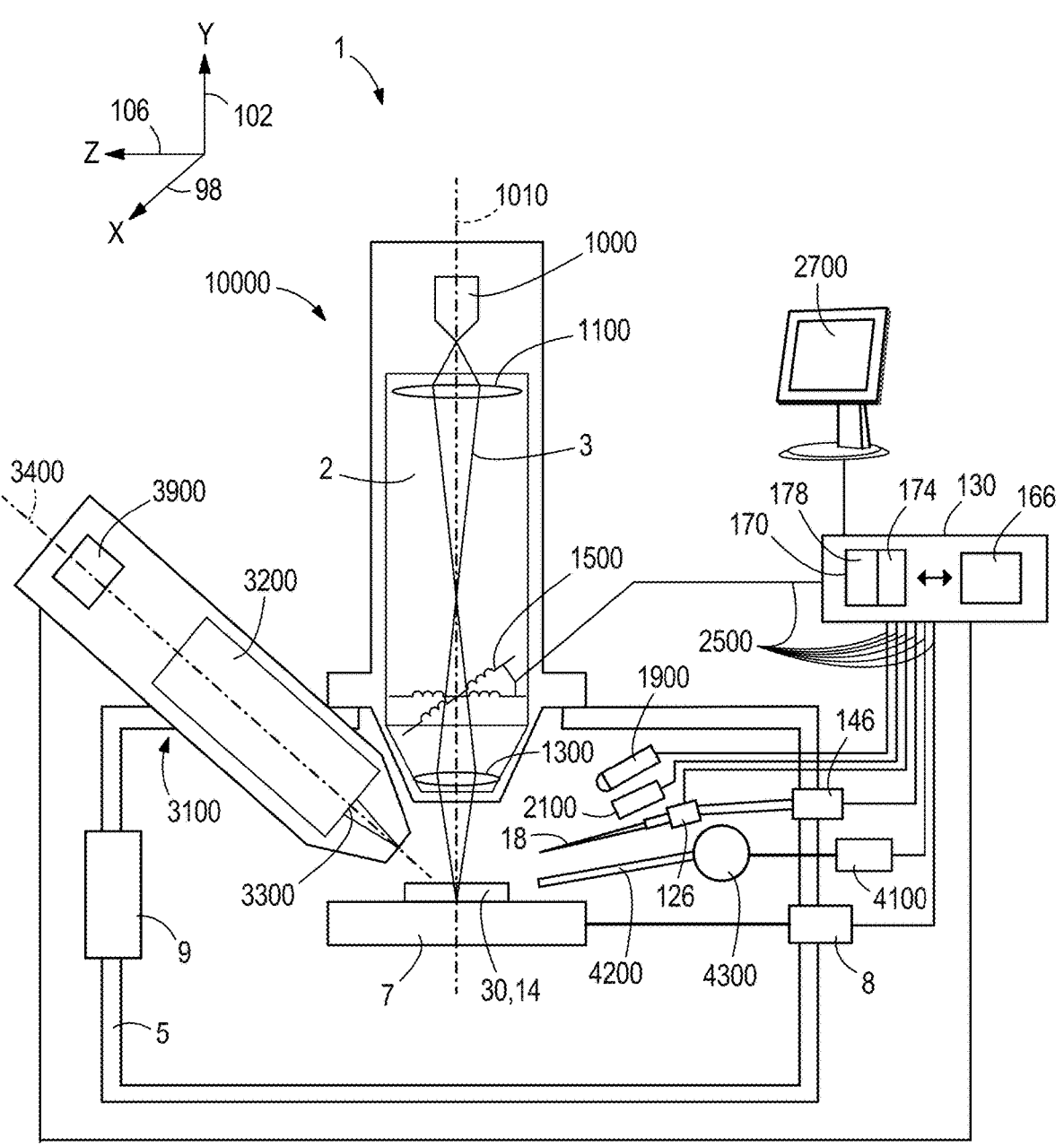
FIG. 7 is a schematic diagram of a dual-beam charged particle microscopy (CPM) system including the sample manipulation system.

FIG. 7 is a highly schematic depiction of an embodiment of a dual-beam charged particle microscopy (CPM) system, such as a microscope 1, in which the sample manipulation system 10 may be implemented; more specifically, it shows an embodiment of a FIB-SEM. The microscope 1 comprises an electron-optical column 10000, which produces a beam 3 of charged particles (in this case, an electron beam) that propagates along an electron-optical axis 1010. Electron-optical axis 1010 may be aligned with the Y axis 102 of the system. The column 10000 is mounted on a vacuum chamber 5, which comprises a sample holder 7 and associated actuator(s) 8 for holding/positioning the wafer 30/sample 14. The wire 18 may be finely moved in space by a precision manipulator 146 (which may also be referred to herein as a second actuator), which in turn manipulates the sample 14. The vacuum chamber 5 is evacuated using vacuum pumps (not depicted). Also depicted is a vacuum port 9, which may be opened to introduce/remove items (components, samples) to/from the interior of vacuum chamber 5. Microscope 1 may comprise a plurality of such ports 9, if desired.

The column 10000 comprises an electron source 1000 and an illuminator 2. This illuminator 2 includes lenses 1100 and 1300 to focus the electron beam 3 onto the sample 14, and a deflection unit 1500 (to perform beam steering/scanning of the beam 3). The microscope 1 further includes the controller 130 for controlling inter alia the deflection unit 1500, lenses 1100, 1300, wire 18, detectors 1900, 2100, and a display unit 2700 for displaying information gathered from the detectors 1900, 2100.

In addition to the electron column 10000 described above, the microscope 1 also comprises an ion-optical column 3100. This comprises an ion source 3900 and an illuminator 3200, and these produce/direct an ion beam 3300 along an ion-optical axis 3400. To facilitate easy access to the sample, the ion axis 3400 is canted relative to the electron axis 1010. As hereabove described, such an ion (FIB) column 3100 can, for example, be used to perform processing/machining operations on the sample 14, such as incising, milling, etching, depositing, etc. The ion column 3100 can also be used to produce imagery of the sample 14. It should be noted that ion column 3100 may be capable of generating various different species of ion at will; accordingly, references to ion beam 3300 should not necessarily been seen as specifying a particular species in that beam at any given time—in other words, the beam 3300 might comprise ion species A for operation A (such as milling) and ion species B for operation B (such as implanting), where species A and B can be selected from a variety of possible options. The ion source 3900 may be a liquid metal ion source or a plasma ion source.

Also illustrated is a Gas Injection System (GIS) 4300, which can be used to effect localized injection of gases, such as etching or precursor gases, etc., for the purposes of performing gas-assisted etching or deposition. Such gases can be stored/buffered in a reservoir 4100, and can be administered through a narrow nozzle 4200, so as to emerge in the vicinity of the intersection of axes 1010 and 3400, for example.

The detectors 1900, 2100 are chosen from a variety of possible detector types that can be used to examine different types of "stimulated" radiation emanating from the sample 14 in response to irradiation by the (impinging) beam 3 and/or beam 3300. Detector 1900 may include an X-ray detector, such as Silicon Drift Detector (SDD) or Silicon Lithium (Si(Li)) detector, for example. Detector 2100 may include an electron detector in the form of a solid-state photomultiplier (SSPM) or evacuated photomultiplier tube (PMT) for example. This can be used to detect backscattered and/or secondary electrons emanating from the sample. The skilled artisan will understand that many different types of detectors can be chosen in a set-up such as that depicted, including, for example, an annular/segmented detector. By scanning the beam 3 or beam 3300 over the sample 14, stimulated radiation—comprising, for example, X-rays, infrared/visible/ultraviolet light, secondary ions, secondary electrons (SEs) and/or backscattered electrons (BSEs)— emanates from the sample. Since such stimulated radiation is position-sensitive (due to said scanning motion), the information obtained from the detectors 1900 and 2100 will also be position-dependent. Thus, the detectors 1900, 2100 may be embodied as charged particle cameras, though in some implementations any optical detector may be employed.

The signals from the detectors 1900 and 2100 pass along control lines (buses) 2500, are processed by the controller 130, and displayed on display unit 2700. Such processing may include operations such as combining, integrating, subtracting, false coloring, edge enhancing, and other processing known to the skilled artisan. In addition, automated recognition processes may be included in such processing. The controller includes the non-transitory memory 170 for storing computer readable instructions and the processor 166. Methods disclosed herein may be implemented by executing the computer readable instructions in the processor. For example, the controller 130 may control the microscope 1 to mill and image the sample 14, collect data, and process the collected data for generating the 3D model of the features inside the sample 14. The controller 130 may control the microscope 1 to mill a sample 14 mounted on a TEM grid 22, image the milled sample 14, and display the image on the display 2700. The controller 130 may adjust the ion beam energy by adjusting one or more lenses 1100, 1300 and/or the ion source 3900. The controller 130 may adjust the ion beam direction relative to the sample 14 by adjusting either the sample orientation and/or the optical parts in the ion column 3100.

The precision manipulator 146 may be operatively coupled to move the sample manipulation system 10 in three-dimensional space. The precision manipulator 146 can provide fine position adjustment, e.g., in increments on the order of tens or hundreds of nanometers. As one example, the fine position adjustment may be in 100 nm increments. Thus, the precision manipulator 146 is configured to move the wire 18 to the position of the sample 14 (as illustrated in FIG. 1), which may then be cut from the wafer 30, and then to move the sample 14 to the TEM grid 22 (as illustrated in FIG. 2). Once the sample 14 has been delivered to the TEM grid 22, the wire 18 is severed (as illustrated in FIG. 3). A severed portion 16 of the wire 18 remains attached to the sample 14. The severed portion 16 typically has a severed length 20 (FIG. 3) of between 1 and 2 micrometers but may have any length depending on the operation.

With continued reference to FIG. 7, the sample manipulation system 10 may be in operative communication with the detectors 1900, 2100. The sample manipulation system 10 may also be in operative communication with the controller 130. The controller 130 may include the processor 166 (e.g., a microprocessor 166, a microcontroller 130, or another suitable programmable device) and the non-transitory memory 170. The memory 170 may include, for example, a program storage area 174 and a data storage area 178. The program storage area 174 and the data storage area 178 can include combinations of different types of memory 170, such as read only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, electronic memory devices, or other data structures. Programming may be coded or learned, such as by way of a neural network, or a combination of both. For example, the neural network may be trained to measure lengths and/or relative positions between components in the field of view of one of the detectors 1900, 2100, or such programming may be coded.

The controller 130 may include one or more inputs and outputs to and from various components, as described above with respect to FIG. 7. The controller 130 may be configured to provide control signals to the outputs and to receive data and/or signals (e.g., detector data, user input signals, etc.) from the inputs. The one or more inputs may include, but are not limited to, the detectors 1900, 2100, which are configured to monitor the positions of one or more of the wire 18, the sample 14, and the carrier 38 of the sample manipulation system 10. The one or more outputs may include, but are not limited to, the actuator 126, the precision manipulator 146, and may include other components. Thus, the controller 130 may be programmed to control the position of the wire 18 and the feed mechanism 54 based on feedback from one or both of the detectors 1900, 2100. For example, the controller 130 may be programmed to automatically or semi-automatically adjust the length 138 of the protruding portion 26 and the position of the distal end 82 of the wire 18 in space based on the feedback.

The detectors 1900, 2100 may be configured to send a signal, such as image(s) and/or video, to the controller 130. The controller 130 may be configured, e.g., with an image recognition system, to detect the length 138 of the protruding portion 26.

In operation, in response to the length 138 being less than a first predetermined length, the controller 130 may activate the actuator 126 to drive the wire 18 through the aperture 86. The first predetermined length may be set by the user to a value indicating that the length 138 is shorter than desired for performing a lift-out. As one example, the first predetermined length may be between 1 and 10 micrometers, such as 5 micrometers in one example. In other examples, the first predetermined length may be any suitable length. The controller 130 may be configured to drive the wire 18 the drive length. The controller 130 may be configured to drive the wire 18 until the detector 1900, 2100 detects that a second predetermined length has been reached, wherein the second predetermined length is greater than the first predetermined length. The second predetermined length may be set by the user to a value indicating that the length 138 is suitable for performing a lift-out. As one example, the second predetermined length may be 20 micrometers. As another example, the second predetermined length may be any length in the range of 10 micrometers to 20 micrometers. In other examples, the second predetermined length may have any suitable value. In some examples, the first and the second predetermined lengths are the same, which may achieve ultra-fine control of the length 138.

The controller 130 may be configured, e.g., with the image recognition system, to extract data from the detector signal, such as the location of the wire 18 in relation to the sample 14. However, in some implementations, the location of the wire 18 in relation to the sample 14 may be detected by a detector separate from the detectors 1900, 2100.

In another implementation, the feedback from the detectors 1900, 2100 need not be employed. Instead, the controller 130 may log the number of lift-out processes that have occurred and activate the actuator 126 in response to n lift-out processes, e.g., at least 100 lift-out processes.

With continued reference to FIG. 7 the electronic controller 130 may be configured to automatically or semi-automatically control the actuator 126 and the precision manipulator 146 in response to detector feedback. Thus, the controller 130 controls movement of the wire 18 in response to detector feedback. More specifically, the electronic controller 130 may be configured to control the position of the distal end 82 of the wire 18 in 3-dimensional space, e.g., to move the distal end 82 of wire 18 to engage with the sample 14 while the sample is still attached to the wafer 30 or to move the sample 14 to the TEM grid 22. Controlling the position may include moving the carrier 38 (which in turn moves the wire 18) in the X-direction, the Y-direction, the Z-direction, and/or rotation, in any combination or orientation. The electronic controller 130 may be further configured to control the length 138 of the protruding portion 26. The length 138 may be between 1 and 20 micrometers. The electronic controller 130 may further be configured to activate the actuator 126 (e.g., when the length 138 is less than the first predetermined length or when n lift-out processes have occurred).

Figure 8:
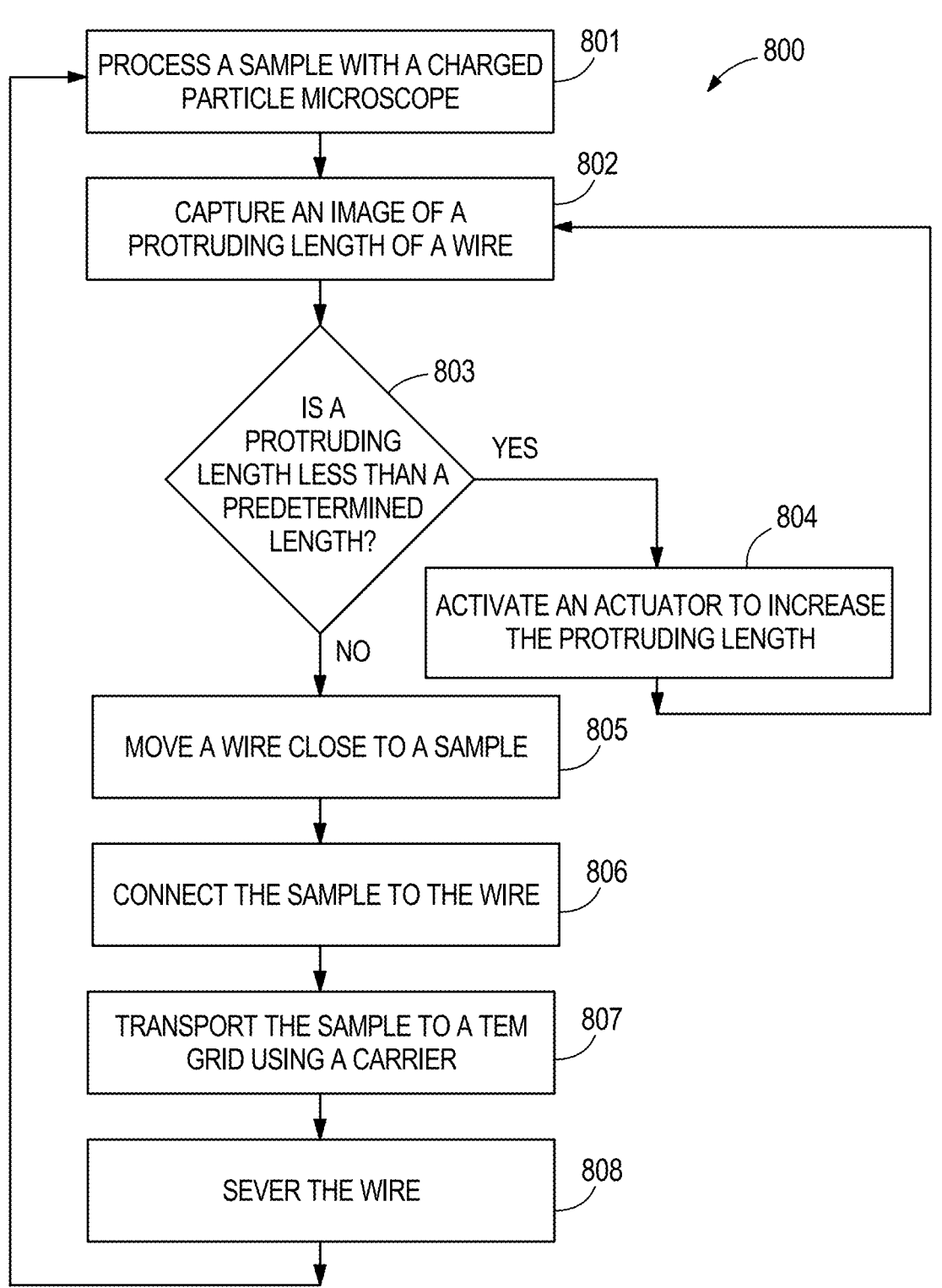
FIG. 8 is a flow chart depicting a method of manipulating a sample using the sample manipulation system.

FIG. 8 is a flowchart depicting a method 800 for sample handling in a charged particle microscope. The method may include any one or more of steps 801-808, amongst other additional and intermediary steps apparent from the disclosure, in any combination. Some or all of the method may be carried out by the electronic controller 130.

At step 801 a sample 14, such as a lamella, is processed with the charged particle microscope 1.

At step 802, one or more first images of the carrier 38 is acquired, and a length of the protruding portion 26 of the wire 18 is determined from the first image(s). For example, the length 138 of the protruding portion 26 is determined based on images acquired from the detector 1900, 2100. Step 802 may include moving at least a portion of the carrier 38 into a field of view of the detector 1900, 2100 before acquiring the first images.

At step 803, the controller determines whether the protruding length is less than the first predetermined length. It should be understood that "less than" may also mean "less than or equal to." NO goes to step 805. YES goes to step 804. For example, the controller 130 determines whether the length 138 is less than the first predetermined length.

At step 804, in response to the length 138 being less than the first predetermined length, the controller 130 activates the actuator 126 such that the length 138 of the protruding portion 26 increases. Step 804 may additionally or alternatively include using feedback to control the protruding length 138 or feeding the wire 18 a predetermined length. Once the protruding length has been increased, the method returns to step 802. Steps 802, 803, and 804 repeat until the length 138 of the protruding portion 26 is not less than the predetermined length (NO at step 803).

At step 805, the second actuator (such as the precision manipulator 146) is controlled to move the distal end 82 of the wire 18 to the sample 14 (see also FIG. 1). In step 805, one or more second images may be acquired. Step 805 may include detecting the location of the sample 14 in relation to the distal end 82 of wire 18 using one or both of the detectors 1900, 2100. In one example, the one or both of the detectors 1900, 2100 detects the location of the sample 14 based on the second images. The second images may include both the sample 14 and the distal end 82 of the wire 18. The wire 18 may then be moved with high precision to the vicinity of sample 14 guided by the second images. In one example, the carrier 38 supports the wire 18 which supports the sample 14.

At step 806, the wire 18 is connected to the sample 14, such as by welding. Any suitable adhesive means may be used to connect the sample 14 to the wire 18.

At step 807, the sample 14 is handled while attached to the wire 18. In one example, the carrier 38 transports the sample 14 to the TEM grid 22 (see also FIG. 2). Step 807 may further include attaching the sample 14 to the TEM grid 22. The sample 14 may be attached to the TEM grid 22 through any suitable adhesion means or by simply placing the sample 14 onto the TEM grid 22. In another example, the sample 14 is further processed or imaged in the charged particle microscope 1 while attached to the wire 18.

At step 808, the wire 18 is severed (see also FIG. 3) such that the severed portion 16 is separated from the rest of the wire 18. The severed portion 16 of the protruding portion 26 of the wire 18 remains attached to the sample 14. The sample 14 and the wire 18 may be separated in any suitable way. For example, the wire 18 may be severed using any suitable separation device, such as one or more blades configured to cut the wire 18, one or more clamps configured to stretch and break the wire 18, etc. After the wire 18 is severed, the microscope 1 may be used for another lift-out process and thus returns to step 801.

Other methods of manipulating the sample 14 with the carrier 38 are possible.

Thus, the method 800 generally includes determining whether the protruding length is less than the predetermined length and, if necessary, increasing the protruding length by activating the actuator 126 to provide sufficient length of wire 18 to attach to the sample 14. Determination of the protruding length may be made using feedback (e.g., image data) from one or more detectors. The method also generally includes using feedback from one or more of the detectors (e.g., image data) to control the precision manipulator 146 to move the wire 18 to the sample 14. The method 800 also generally includes transporting the sample 14 to the TEM grid 22 using the carrier 38, also by way of the precision manipulator 146, connecting the sample 14 to the TEM grid 22, and severing the wire 18. Some of the steps 801-808 may be performed in other suitable orders. Further method steps, subsequent or intermediary, in the method 800 may be apparent from the above disclosure.

The feed mechanism 54 of the sample manipulation system 10 provides advantages. If a needle was used (as is typical in lift-out process), the needle would likely need a sharpening process to reduce the dimension (such as width/diameter) of the needle tip. Needle sharpening may take on the order of hours. The wire 18 used for the present feed mechanism 54 has a constant diameter such that sharpening time may be reduced or eliminated. Additionally, the number of lift-outs that may occur before the wire 18 is replaced is increased by sample manipulation system 10 of the present disclosure. The uniform width/diameter of the wire 18 further improves automation repeatability and improves the lift-out process throughput.

Thus, the disclosure provides a sample manipulation system 10 and a method 800 of feeding the wire 18. Various features and advantages of the disclosure are set forth in the following claims.

What is claimed is:

1. A sample manipulation system for a sample to be used in a charged particle beam process, the sample manipulation system comprising:
   a carrier defining a first carrier end, a second carrier end opposite the first carrier end, and a passageway extending between the first carrier end and the second carrier end along a feed direction;
   a wire slidably supported and at least partially housed by the carrier, the wire configured to slide through the passageway, the wire including a supported portion and a protruding portion, wherein the supported portion is disposed in the passageway and the protruding portion extends from the first carrier end for engaging the sample; and
   a feed mechanism including an electrically powered actuator positioned closer to the second carrier end than the first carrier end and configured to drive the wire through the passageway along the feed direction to control a length of the protruding portion.

2. The sample manipulation system of claim 1, wherein a width of the wire is 10 micrometers or less.

3. The sample manipulation system of claim 1, wherein the wire is made of tungsten.

4. The sample manipulation system of claim 1, wherein the length of the protruding portion is between 1 and 20 micrometers.

5. The sample manipulation system of claim 1, wherein the electrically powered actuator includes a motor or a piezoelectric actuator.

6. The sample manipulation system of claim 1, wherein the feed mechanism further includes a clamp mechanism or a pinch roller, and wherein the electrically powered actuator is operatively coupled with one or both of the clamp mechanism or the pinch roller to drive the wire.

7. A method of manipulating a sample with the sample manipulation system of claim 1, wherein the electrically powered actuator is a first actuator, the method comprising:
   acquiring an image;
   driving, via a first actuator of the sample manipulation system, the wire through the passageway to a predetermined length of the protruding portion of the wire; and
   adjusting, via a second actuator coupled to the sample manipulation system, a distance between a distal end of the wire and the sample.

8. The method of claim 7, further comprising: acquiring one or more second images including a portion of the sample and the distal end of the wire, and adjusting the distance between the distal end of the wire and the sample based on the second images.

9. The method of claim 8, wherein the second images are scanning electron microscopy (SEM) images.

10. The method of claim 7, wherein the second actuator is configured to translate and rotate the sample manipulation system with at least four degrees of freedom.

11. The method of claim 7, wherein the image includes at least a portion of the carrier.

12. The method of claim 7, wherein the image is a SEM image or an optical image.

13. The method of claim 7, further comprising attaching the distal end of the wire and the sample.

14. A charged particle microscope, comprising:

a sample holder for holding a sample;

a sample manipulation system comprising:

a carrier defining a passageway;

a wire slidably supported and at least partially housed by the carrier, the wire including a supported portion and a protruding portion, wherein the supported portion is disposed in the passageway and the protruding portion extends from the carrier for engaging the sample; and a feed mechanism including a first actuator configured to drive the wire along the passageway, wherein the first actuator is an electrically powered actuator;

a second actuator coupled to the sample manipulation system;

at least one detector; and a controller including a processor and a non-transitory memory for storing computer readable instructions, by executing the instructions in the processor, the charged particle microscope is configured to:

acquire, via the detector, an image;

adjust, via the first actuator, a length of the protruding portion of the wire from the carrier based on the acquired image; and adjust, via the second actuator, a relative position between a sample and a distal end of the wire.

15. The charged particle microscope of claim 14, further comprising a charged particle source for generating a charged particle beam, and the charged particle microscope is further configured to: direct the charged particle beam towards the sample to attach the sample to the distal end of the wire.

16. The charged particle microscope of claim 14, wherein the detector includes an electron detector, and wherein adjust the length of the protruding portion of the wire from the carrier based on the acquired image includes: determine the length of the protruding portion of the wire based on the acquired image, and adjust the length of the protruding portion based on the determined length of the protruding portion.

17. The charged particle microscope of claim 14, wherein adjust the length of the protruding portion of the wire from the carrier based on the acquired image includes adjust the length of the protruding portion to a predetermined length based on the acquired image.

18. The charged particle microscope of claim 17, wherein the predetermined length is between 1 and 10 micrometers, and the wire is a tungsten wire.

19. The charged particle microscope of claim 14, further comprising an electron source, and wherein the relative position between the sample and the distal end of the wire is adjusted based on one or more SEM images.

* * * * *